(12) United States Patent
Fujioka (10) Patent No.: US 6,198,619 B1
(45) Date of Patent: Mar. 6, 2001

(54) CAPACITOR NETWORK

(75) Inventor: Shuzo Fujioka, Hyogo (JP)

(73) Assignees: Mitsubishi Denki Kabushiki Kaisha, Tokyo; Mitsubishi Electric System LSI Design Corporation, Hyogo, both of (JP)

( * ) Notice: Subject to any disclaimer, the term of this patent is extended or adjusted under 35 U.S.C. 154(b) by 0 days.

(21) Appl. No.: 09/184,019

(22) Filed: Nov. 2, 1998

(30) Foreign Application Priority Data

Apr. 24, 1998 (JP) .................................................. 10-114780

(51) Int. Cl.$^7$ .............................. H01G 4/255; H01G 4/00; H01L 27/01
(52) U.S. Cl. ................... 361/328; 361/301.2; 361/301.6; 361/311
(58) Field of Search .............................. 361/301.1, 301.2, 361/301.3, 303, 306.1, 306.2, 308.1, 308.3, 309, 765, 766, 328, 311–319, 320, 321.1–321.6, 329; 174/260

(56) References Cited

U.S. PATENT DOCUMENTS 3,886,415 * 5/1975 Genthe ................................. 361/314
4,855,866 * 8/1989 Imamura et al. ..................... 361/306
4,866,566 * 9/1989 Imamura et al. ..................... 361/306

FOREIGN PATENT DOCUMENTS 62-233913    10/1987  (JP) .

* cited by examiner

Primary Examiner—Kristine Kincaid
Assistant Examiner—Eric Thomas (57) ABSTRACT

A capacitor network has an uncomplicated construction enabling the capacitance of the capacitor network to be easily increased or decreased. The capacitor network has a plurality of component capacitors formed from two metallic foil layers on opposite sides of a printed circuit board interconnected by lines disposed on both sides of said printed circuit board. The component capacitors of the capacitor network are arranged into at least one series circuit section and at least one parallel circuit section. The series circuit section includes two or more component capacitor, each including at least one component capacitor, connected in series. The parallel circuit section includes two or more parallel-connected component capacitor circuits, each including at least one component capacitor.

3 Claims, 7 Drawing Sheets

CAPACITOR NETWORK

BACKGROUND OF THE INVENTION

1. Field of the Invention

The present invention relates to a capacitor network of which line patterns are formed on both sides on a printed circuit board.

2. Description of the Related Art

A capacitor network typical in the related art comprises a plurality of component capacitors interconnected such that the capacitance (composite capacitance) of the capacitor network can be reduced. Each component capacitor is formed from a pair of metallic foil layers on opposite sides of a printed circuit board.

Figure 11:
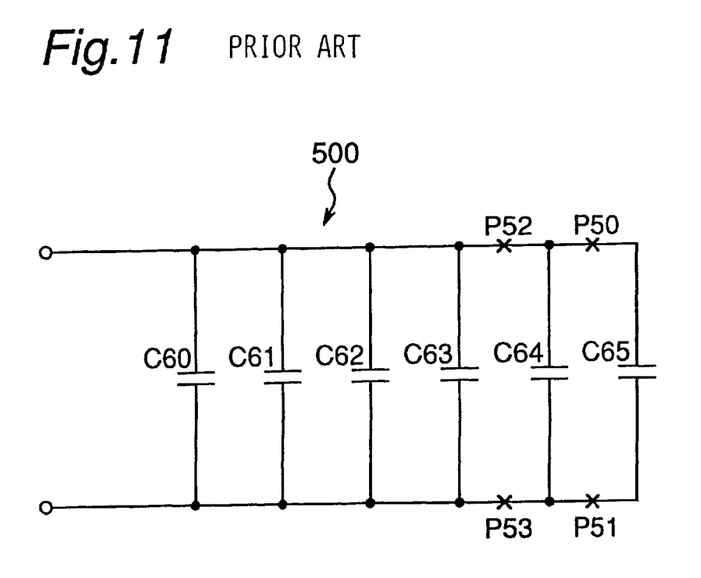
FIG. 11 is an equivalent circuit diagram of a capacitor network according to the related art.

FIG. 11 shows the equivalent circuit of a typical capacitor network 500 as described above. The component capacitors C60 to C65 of this capacitor network 500 are formed from two metallic foil layers on opposite sides of a printed circuit board, and are connected in series. The capacitance of this capacitor network 500 is the sum of the capacitance of each component capacitor C60 to C65. As a result, the capacitance of the capacitor network 500 can be reduced by an amount equal to the capacitance of the last capacitor C65 in this example by cutting the lines at points P50 and P51 to isolate the capacitor C65 from the network. The capacitance of the capacitor network 500 can be further reduced by an amount equal to the capacitance of capacitor C64, for example, by similarly cutting the lines at points P52 and P53.

It will be clear that the capacitance of this capacitor network 500 can only be adjusted downward by electrically isolating a number of component capacitors from the network. This creates the problem of not being able to optimally adjust the capacitance of the capacitor network 500 in certain cases.

Consider, for example, a contactless IC card in which an LC resonance circuit containing a capacitor network 500 as a circuit element is used as an antenna, and the capacitance of the capacitor network 500 is set to the capacitance (the "optimum capacitance" below) providing the greatest read/write distance to the reader/writer. The optimum capacitance is determined in this case by actually adjusting (reducing) the capacitance of the capacitor network 500 while measuring the read/write distance to the reader/writer.

The value of this optimum capacitance is the capacitance at which the resonance frequency of the LC resonance circuit of the contactless IC card matches the operating frequency of the reader/writer. With the above-noted method of setting the optimum capacitance, however, it is not possible to predict at what point the capacitance of the capacitor network 500 will be closest to the optimum capacitance. As described above, the capacitance of the capacitor network 500 can only be reduced in increments equal to the capacitance of the component capacitors. The capacitance of the capacitor network 500 is therefore always set to the last-adjusted value, that is, to the capacitance at which the network capacitance is less than the optimum capacitance or the capacitance resulting in a short circuiter read/write distance. It should be noted that while it is possible to increase the capacitance of the capacitor network 500 in such cases, this requires reconnecting the cut lines, a complicated and costly task.

For some applications a variable capacitor component can be mounted on the circuit board in place of a capacitor network 500, but these components are typically thick, large, and expensive. Such capacitor components also cannot be used on certain products having specific thickness limitations, including credit-card-size contactless IC cards with an ISO-standard 0.76 mm thickness limit.

It is noted that Japan Unexamined Patent Publication (kokai) S62-233913 (1987-233913) teaches a capacitor whereby the capacitance distributed to the front and back of the circuit board through through-holes is controlled using the circuit board thickness. The problem with this design, however, is that once the thickness of the circuit board is fixed, the capacitance of the capacitor cannot be changed. The above-described problem is therefore not resolved.

There is therefore a need for a capacitor network of simple configuration whereby the composite capacitance of the capacitor network can be easily increased and decreased.

SUMMARY OF THE INVENTION

To address the above-described need, an object of the present invention is to provide a capacitor network whereby the composite network capacitance can be increased or decreased.

More specifically, a capacitor network having a plurality of component capacitors formed from two metallic foil layers on opposite sides of a printed circuit board interconnected by lines disposed on both sides of said printed circuit board comprises at least one series circuit section and at least one parallel circuit section. The series circuit section comprises two or more component capacitor circuits, each comprising at least one component capacitor, connected in series. The parallel circuit section comprises two or more parallel-connected component capacitor circuits, each comprising at least one component capacitor.

The capacitance of the capacitor network thus comprised can be increased by short circuiting component capacitors connected in series, and can be decreased by cutting component capacitors connected in parallel from the circuit.

Corresponding lines on the front and back sides of the printed circuit board are preferably disposed to non-overlapping positions. As a result, line capacitance can also be eliminated.

Furthermore, of the two metallic foil layers used to form the component capacitors of the series circuit section, one or both of the foils is preferably a plastically deformable, conductive material that can be caused to contact the other metallic foil layer disposed at the corresponding position on the opposite side of the printed circuit board by inserting a needle. When thus comprised, a needle can be inserted to easily short circuit a component capacitor.

The component capacitors connected in series are also preferably formed with different capacitances. This makes it possible to adjust the network capacitance more precisely.

A capacitor network according to the present invention further preferably comprises at least one short circuiting line for short circuiting a series connected component capacitor. When thus comprised, the short circuiting line can be cut to reduce the capacitance of the capacitor network.

A further capacitor network according to the present invention preferably comprises a series-parallel circuit in which two or more parallel circuits of two or more component capacitor circuits connected in parallel are series connected. This enables fine adjustment of the capacitance.

Yet a further capacitor network according to the present invention comprises two or more series-parallel circuits connected in parallel where each series-parallel circuit comprises two or more parallel circuits of two or more component capacitor circuits connected in parallel. This configuration enables even more precise capacitance adjustment.

Note that network capacitance can be set with yet greater precision by changing the number of parallel connected component capacitors in each series parallel circuit.

Further preferably, each component capacitor series connected by the lines comprises a means enabling contact with the metallic foil on the back side of the printed circuit board from the front of the printed circuit board. This makes it possible to effectively short circuit a component capacitor using a test probe, for example, to increase the capacitor network capacitance without actually short circuiting the component capacitor. This functionality can be used during adjustment to easily determine whether the capacitance of the capacitor network should be increased or decreased.

The capacitance of the capacitor network can also be finely adjusted by cutting a number of parallel-connected component capacitors from the capacitor network lines, and short circuiting a number of series-connected component capacitors. The capacitance can also be increased by short circuiting remaining series-connected component capacitors, and can be reduced by cutting off from the circuit remaining parallel-connected component capacitors.

The capacitance of a capacitor network according to the present invention is further preferably set to a value exceeding individual differences in the capacitance required by the device using the capacitor network. In addition, either the composite capacitance of the two or more component capacitor circuits of the parallel circuit section, or the difference between the composite capacitance of the two or more component capacitor circuits of the series circuit section and the composite capacitance when one of the two or more component capacitor circuits is short circuited, is set to less than the capacitance error tolerated by the device using the capacitor network. When thus comprised, the capacitance of the capacitor network can be adjusted in an order suited to the device using the capacitor network.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

A capacitor network according to the present invention as outlined above comprises a plurality of component capacitors organized into at least two groups, at least one group containing a plurality of serially connected component capacitors and at least one group containing a plurality of parallel connected component capacitors. The capacitance of the capacitor network (the "network described" below) can be reduced with this configuration by reducing the number of component capacitors connected in parallel, and can be increased by short circuiting a number of component capacitors connected in series.

Some preferred embodiments of a capacitor network thus comprised are described below with reference to the accompanying figures.

(1-1) Embodiment 1

Figure 1:
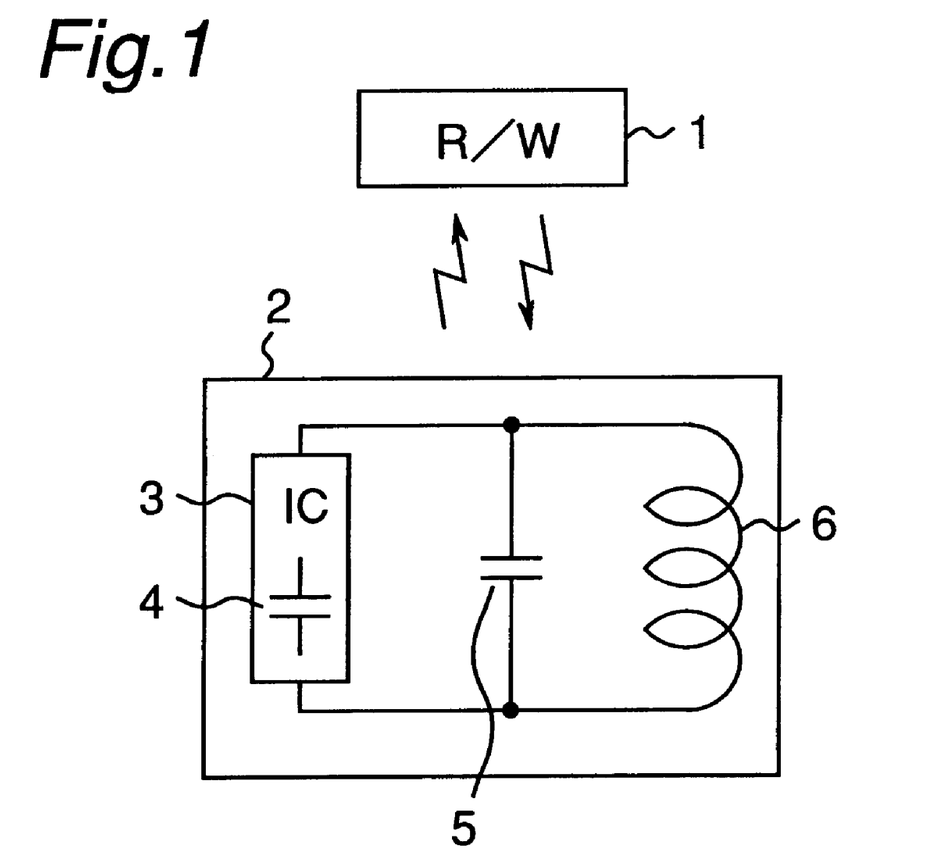
FIG. 1 is a typical overview of a system having a reader/writer for accessing a contactless IC card containing a capacitor network.

FIG. 1 is a simplified drawing of a system comprising a reader/writer 1 for communicating with a contactless IC card, and a contactless IC card 2 comprising a capacitor network 5 according to a first embodiment of the present invention. Both the reader/writer 1 and contactless IC card 2 are ISO-standard devices operating at a specified transmission frequency of 13.56 MHz. The contactless IC card 2 comprises a LC resonance circuit functioning as an antenna, and an IC chip 3 connected to the LC resonance circuit. The LC resonance circuit comprises the capacitor network 5 and a coil 6. The capacitance of the IC chip 3 is represented in FIG. 1 as chip capacitor 4.

Figure 2:
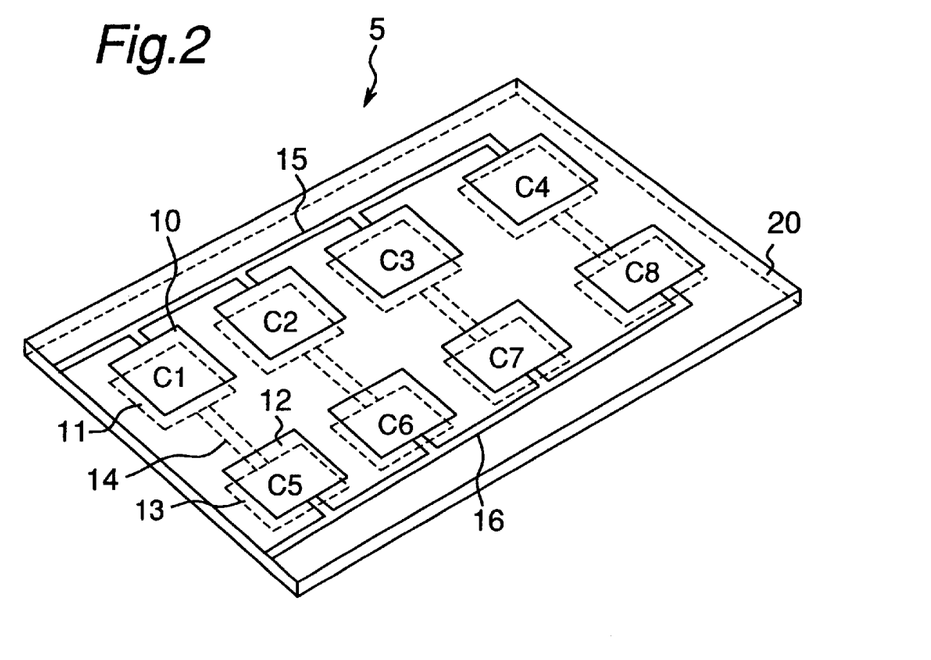
FIG. 2 is an oblique view of a capacitor network according to a first example of the present invention.

A typical configuration of the capacitor network 5 shown in FIG. 1 is shown in FIG. 2. As shown in FIG. 2, the capacitor network 5 is a series-parallel network of two series-connected capacitors in four parallel-connected stages.

The capacitance (composite capacitance) of the capacitor network 5 is set to a value sufficient to compensate for individual variations in the capacitance of the chip capacitor 4 of the IC chip 3. In addition, the capacitance of each component capacitor of the capacitor network 5 is set so that the difference between the composite capacitance of two series-connected component capacitors C1 and C5, and the composite capacitance thereof when one, e.g., capacitor C1, of the two component capacitors is short circuited, is less than the error allowable by the reader/writer 1, the composite capacitance of the parallel-connected component capacitors C1 and C5 is less than the error allowable by the reader/writer 1, or both said series-connected composite capacitance difference and the parallel-connected composite capacitance are less than the allowable error.

The capacitance of each capacitor C1 to C8 in the capacitor network 5 is 10 pF in this first embodiment. Component capacitor C1 is formed from front and back copper foils 10 and 11, respectively, as seen in FIG. 2 with a thin polyimide printed circuit board 20 disposed therebetween. Component capacitor C5 is likewise formed from front and back copper foils 12 and 13 with the thin polyimide printed circuit board 20 disposed therebetween. The back copper foils 11 and 13 are interconnected by back line 14. Each of the other component capacitor pairs C2 and C6, C3 and C7, and C4 and C8 is likewise formed. The series-connected capacitor pairs C1 and C5, C2 and C6, C3 and C7, and C4 and C8 are then parallel connected by front lines 15 and 16.

Note that the front lines 15 and 16 and the back lines, for example back line 14, are disposed on opposite sides of the printed circuit board 20 at non-overlapping positions to eliminate line capacitance. Note, further, that this is also the case in each of the following embodiments 2 to 5.

Figure 3:
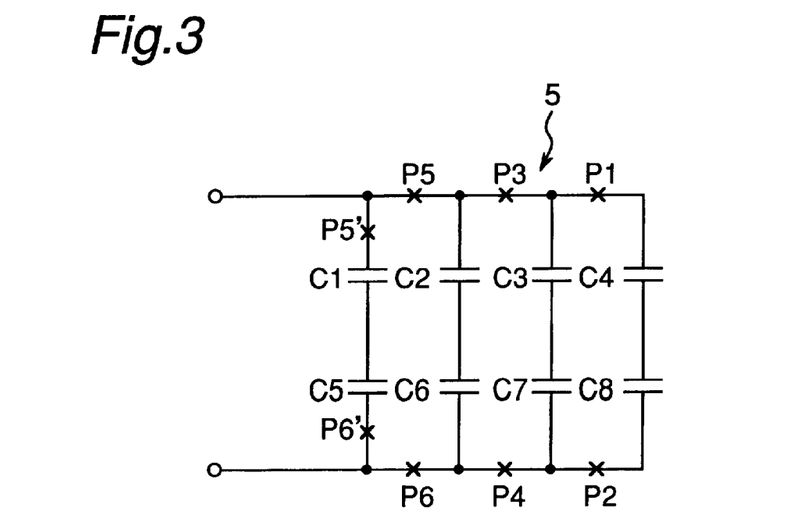
FIG. 3 is an equivalent circuit diagram of the capacitor network shown in FIG. 2.

FIG. 3 is an equivalent circuit diagram of the capacitor network 5. The capacitance of the capacitor network 5 can be reduced by reducing the number of parallel-connected capacitors in the network. This can be accomplished by cutting the lines at points P1 and P2, P3 and P4, and P5 and P6 in sequence.

The capacitance of the capacitor network 5 before any lines have been cut is 20 pF. If the lines are then cut at points P1 and P2, the capacitance of the capacitor network 5 (network capacitance) drops an amount equal to the composite capacitance of the isolated component capacitors C4 and C8, that is, drops 5 pF to 15 pF in this example. The network capacitance can be reduced an additional 5 pF to 10 pF by cutting the lines at points P3 and P4 to remove capacitors C3 and C7 from the network. If further required, the network capacitance can be reduced an additional 5 pF to 5 pF by again cutting the lines, at points P5 and P6, to remove capacitors C2 and C6 from the network.

It will thus be clear that with the capacitor network 5 thus comprised, the smallest unit by which the network capacitance can be reduced is the capacitance (the composite capacitance of the capacitors when two or more component capacitors are series connected as shown in FIG. 3) of parallel-connected component capacitors.

The capacitance of the capacitor network 5 can also be increased by short circuiting a number of series-connected capacitors in the network. For example, if the network capacitance has been lowered to 10 pF by cutting the lines at points P1 and P2 and then at P3 and P4, and it is then necessary to increase the capacitance, one of the two series-connected component capacitors C2 and C6 is short circuited. Short circuiting component capacitor C2, for example, increases the network capacitance 5 pF to 15 pF.

Figure 4:
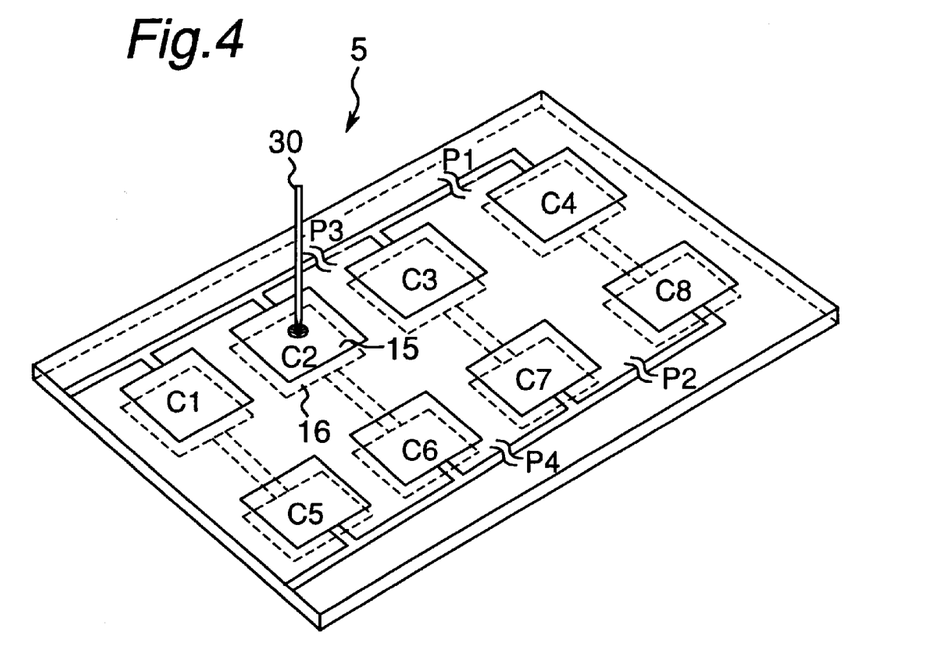
FIG. 4 is an oblique view of a capacitance-adjusted capacitor network according to a first example of the present invention.

Short circuiting the component capacitor C2 is accomplished by piercing the front copper foil 15 with a needle 30 as shown in FIG. 4 to make the front copper foil 15 contact the back copper foil 16. The needle 30 preferably pierces the front copper foil 15 at a plurality of points to increase the reliability of foil-foil contact.

Figure 5:
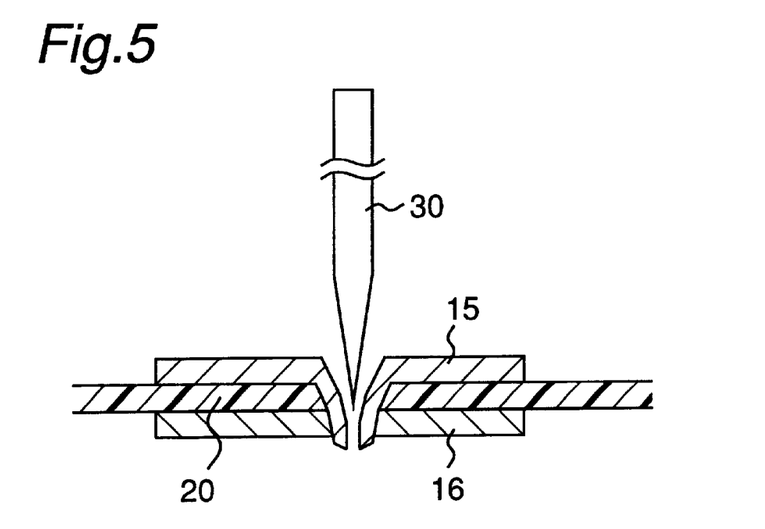
FIG. 5 is a section view of the capacitor network short circuited by a needle.

FIG. 5 is a section view of the component capacitor C2 after being pierced by the needle 30. As shown in the figure, piercing the front copper foil 15 with the needle 30 brings the front copper foil 15 through the hole formed in the printed circuit board 20, causing the front copper foil 15 to contact the back copper foil 16. The thickness of the printed circuit board 20 is determined in part by the length the front copper foil 15 is extended when pierced by the needle 30, and is preferably 100 mm or less.

It will be clear that while the capacitor network 5 of the present embodiment has been described using copper foil to form the component capacitors, other types of metals can also be used. That is, any plastically deformable, conductive metal can be used insofar as insertion of a needle will cause the conductive material on one side of the circuit board to contact the conductive material at the opposing position on the other side of the circuit board.

A component capacitor C2 can also be short circuited by, for example, holding the front and back foil members of the capacitor between probe-like members and applying ultrasonic radiation or heat to locally dissipate the printed circuit board 20, resulting in contact between the front copper foil 15 and back copper foil 16. It is also possible to provide a through-hole in the component capacitor C2, and fill the through-hole with solder or other conductor to establish conductivity between the front copper foil 15 and back copper foil 16.

(1-2) Practical Application

The process of adjusting the capacitance of the capacitor network 5 to obtain the greatest read/write distance between the contactless IC card 2 and reader/writer 1 is described below.

The read/write distance a at the initial capacitance of 20 pF, that is, the capacitance before any line has been cut, is measured first. The lines are then cut at points P1 and P2 to reduce the network capacitance to 15 pF as described above, and the read/write distance b at this capacitance level is then measured. If a<b, the lines are cut at points P3 and P4 to further lower the network capacitance to 10 pF, and the read/write distance C is again measured. If b>C, it is known that the capacitance yielding the greatest read/write distance is greater than 10 pF and less than 20 pF.

As described above, the capacitance of the capacitor network 5 can be increased in 5-pF units. As a result, component capacitor C2 is short circuited to increase the network capacitance 5 pF to 15 pF. The capacitance of the capacitor network 5 can thus be set to the value closest to the capacitance achieving the greatest read/write distance.

If the initial capacitance of the capacitor network 5 is determined to be less than the capacitance achieving the greatest read/write distance when the read/write distance a is measured, component capacitor C4 is short circuited. This increases the network capacitance to 25 pF, and the read/write distance d is then measured. If a<d, a further component capacitor C3 is short circuited to further increase the network capacitance to 30 pF, and the read/write distance e at this network capacitance is measured. If d>e, it is known that the network capacitance yielding the greatest read/write distance is greater than 20 pF and less than 30 pF. The capacitance of the capacitor network 5 is therefore reduced to 25 pF by cutting the lines at points P5' and P6' (see FIG. 3). The capacitance of the capacitor network 5 can thus be set to the value closest to the capacitance achieving the greatest read/write distance.

It is also possible to use capacitors with different capacitance values for the component capacitors connected in series. This makes it possible to set the network capacitance with greater precision.

For example, the capacitance of component capacitors C1 to C4 can be set to 6 pF, and the capacitance of component capacitors C5 to C8 can be 12 pF, resulting in a capacitor network 5 capacitance of 16 pF. Cutting the lines at points P1 and P2 in this case reduces the network capacitance by the composite capacitance of the isolated component capacitors C4 and C8, that is, reduces the network capacitance 4 pF to 12 pF. By then short circuiting component capacitor C3, the network capacitance is increased 8 pF to 20 pF. If component capacitor C7 is short circuited instead of C3, network capacitance increases 2 pF to 14 pF.

It is therefore possible to set the capacitance of the capacitor network 5 with greater precision by using capacitors with different capacitance values for the component capacitors connected in series.

(2) Embodiment 2

Figure 6:
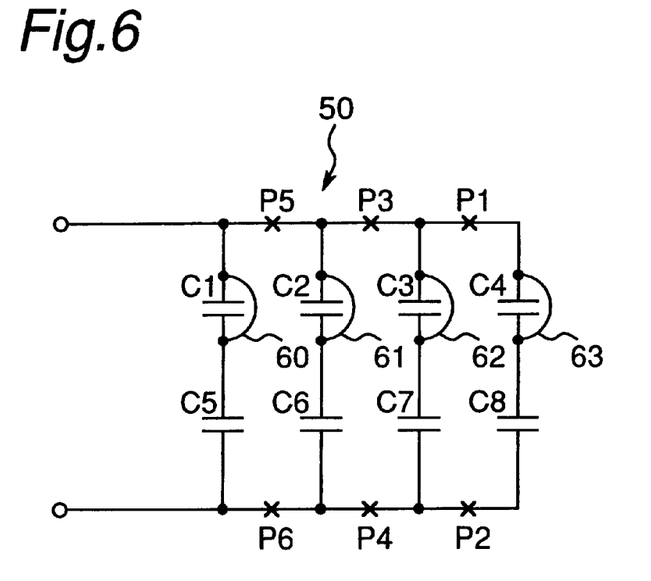
FIG. 6 to FIG. 8 are equivalent circuit diagrams of capacitor networks according to second through fourth examples of the present invention.

FIG. 6 is an equivalent circuit diagram of a capacitor network 50 according to a second embodiment of the present invention. This capacitor network 50 differs from the capacitor network 5 of the first embodiment in further comprising short circuiting lines 60 to 63, and pre-short circuiting component capacitors C1 to C4.

The capacitance of this capacitor network 50 can be reduced using either or both of two methods, that is, cutting the lines at points P1 and P2, P3 and P4, and P5 and P6 to reduce the number of parallel-connected component capacitors (the same method used with the capacitor network 5 of the first embodiment), or cutting one or more of the short circuiting lines 60 to 63 to increase the number of series-connected component capacitors.

The capacitance of the capacitor network 50 in this example is 40 pF. Cutting short circuiting line 63, for example, decreases the network capacitance 5 pF to 35 pF. Piercing the component capacitor C4 with a needle can also restore the network capacitance to the original 40 pF. Note that as described above, capacitance can be decreased in 10 pF units by cutting the lines at P1 and P2, for example.

As also described with reference to the capacitor network 5 of the first embodiment, the capacitance of the capacitor network 50 can be set with greater precision by using capacitors with different capacitance values for the component capacitors connected in series.

It should also be noted that this use of short circuiting lines to pre-short circuit one or more of the series-connected component capacitors can also be applied in the following third through fifth embodiments of the present invention.

(3) Embodiment 3

Figure 7:
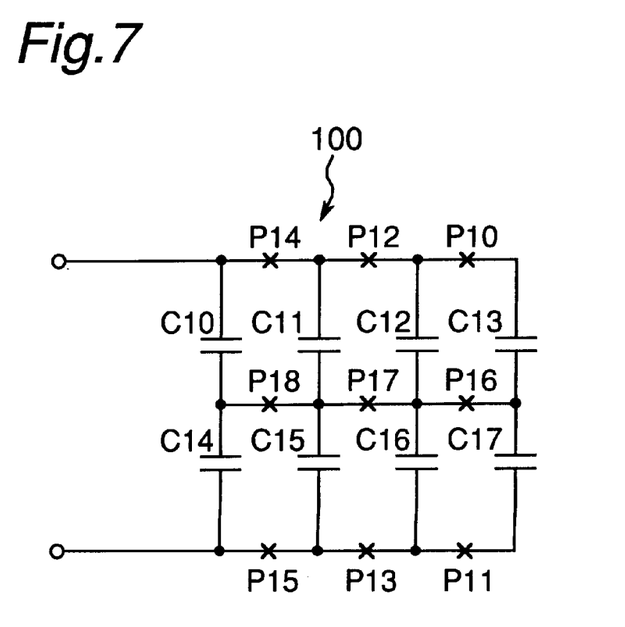

FIG. 7 is an equivalent circuit diagram of a capacitor network 100 according to a third embodiment of the present invention in which two or more parallel circuits of two or more component capacitors each are connected in series.

As shown in FIG. 7, this capacitor network 100 comprises a first parallel circuit of four parallel-connected component capacitors C10 to C13, and a second parallel circuit of four parallel-connected component capacitors C14 to C17, where the first and second parallel circuits are connected in series. The capacitance of each component capacitor C10 to C17 is 10 pF.

The back-side interconnects of this capacitor network 100 are identical to those of the capacitor network 5 described in the first embodiment, and further description thereof is thus omitted below.

The capacitance of this capacitor network 100 is 20 pF. The lines can be cut at points P10 to P15 to appropriately decrease the network capacitance by reducing the number of component capacitors connected in parallel. For example, cutting at point P10 or P11 reduces the network capacitance 2.9 pF to 17.1 pF, while cutting both points P10 and P11 reduces the network capacitance 5 pF to 15 pF.

To increase the network capacitance, the line can be cut at point P16 while also short circuiting component capacitor C13 or C17. In this case, the network capacitance increases 5 pF to 25 pF.

It will thus be clear that while the capacitor network 100 of the present embodiment comprises the same number of component capacitors and has the same initial capacitance as the capacitor network 5 of the first embodiment, it is possible to set the capacitance of the capacitor network 100 with greater precision than is possible with the capacitor network 5 of the first embodiment.

Furthermore, the network capacitance can be adjusted with even greater precision by using capacitors with different capacitance values.

For example, the capacitance of component capacitors C10 to C13 can be 6 pF, and the capacitance of component capacitors C14 to C17 can be 12 pF, resulting in a capacitor network 100 capacitance of 16 pF. Cutting at point P10 in this case reduces the network capacitance 2.9 pF to 13.1 pF. If the line is cut at point P11 instead of P10, the network capacitance decreases 1.6 pF to 14.4 pF. If both P10 and P11 are cut, the capacitance of the capacitor network 100 decreases 4 pF to 12 pF.

Furthermore, if the line is cut at point P16 and component capacitor C13 is short circuited, the network capacitance increases 11 pF to 27 pF. If the line is cut at point P16 and component capacitor C17 is short circuited, the network capacitance increases 5 pF to 21 pF. It will therefore be clear that network capacitance can be adjusted with even greater precision by using capacitors with different capacitance values.

(4) Embodiment 4

Figure 8:
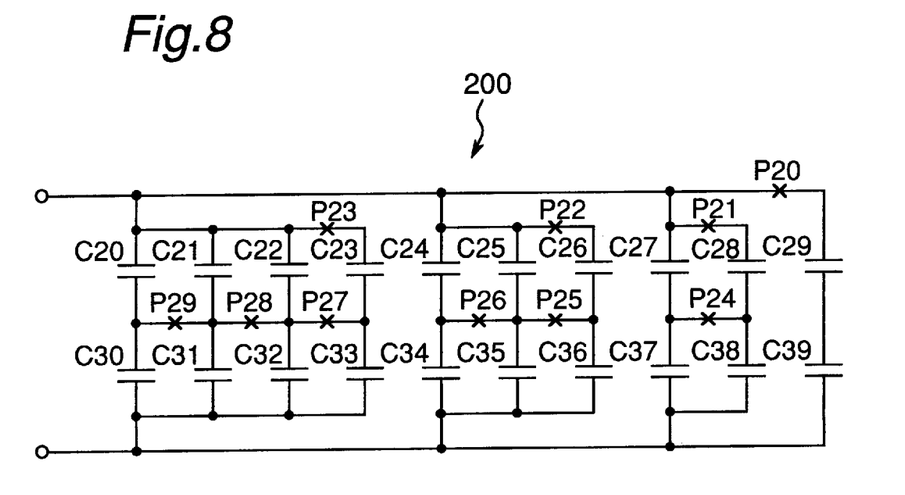

FIG. 8 is an equivalent circuit diagram of a capacitor network 200 according to a fourth embodiment of the present invention in which two or more series circuits, each comprising two or more parallel circuits of two or more component capacitors each connected in series, are connected in parallel. More specifically, a capacitor network 200 according to this fourth embodiment comprises a plurality of parallel-connected series-parallel circuits having 1, 2, 3, or 4 stages of parallel-connected component capacitors in a capacitor network 100 arrangement according to the third embodiment described above.

The capacitance of each component capacitor C20 to C39 in this arrangement is 4 pF. The capacitance of the capacitor network 200 [100, sic?] is 20 pF. The capacitance of the capacitor network 200 can be reduced by cutting at points P20, P21, P22, P23, and so forth to reduce the number of parallel-connected component capacitors.

For example, cutting the line at point P20 reduces the capacitance of the capacitor network 200 2 pF to 18 pF. Cutting at point P21 reduces network capacitance 1.3 pF to 18.7 pF. Cutting at P22 reduces network capacitance 1.2 pF to 18.8 pF. Cutting at P23 reduces network capacitance 1.1 pF to 18.9 pF.

It will thus be clear that the capacitance of the capacitor network 200 can be reduced with increasing precision as the number of stages connected in parallel increases.

The capacitance of the capacitor network 200 can also be increased in the same manner as the capacitor network 100 of the third embodiment, that is, by cutting a line at point P24, P25, P26, and so forth, and short circuiting one of the two component capacitors that becomes connected in series as a result of cutting the line.

For example, short circuiting component capacitor C29 or C39 increases the capacitance of the capacitor network 200 2 pF to 22 pF. Cutting the line at P24 and short circuiting component capacitors C37 and C38 increases the capacitance of the capacitor network 200 4 pF to 24 pF. Cutting at points P25 and P26, and short circuiting component capacitors C34, C35, and C36 increases the capacitance of the capacitor network 200 6 pF to 26 pF. In addition, cutting at points P27, P28, and P29, and short circuiting component capacitors C30, C31, C32, and C33 increases the capacitance of the capacitor network 200 8 pF to 28 pF.

It will thus be clear that by connecting in parallel two or more series-parallel circuits, each comprising a plurality of parallel-connected component capacitors connected in series, and each having a different number of parallel stages, the capacitance of the capacitor network 200 can be set with yet greater precision.

In addition, the capacitance of the capacitor network 200 can be set with yet greater precision by using capacitors with different capacitance values for the component capacitors connected in series.

(5) Embodiment 5

A capacitor network 300 according to a fifth embodiment of the present invention is a capacitor network 200 according to the above fourth embodiment further comprising means enabling contact between a metal layer on the back side of the printed circuit board and each of the series-connected component capacitors from the front of the printed circuit board. More specifically, as shown in FIG. 9, a capacitor network 300 according to the present embodiment comprises a plurality of through-holes whereby a probe 380 can make contact with the lines (back-side lines) connecting each of the component capacitors in parallel.

The capacitance of each component capacitor C40 to C59 in this arrangement is 4 pF. Component capacitor C40 is formed from front and back copper foils 301 and 302, respectively, as seen in FIG. 9 with a thin (100 mm or less) polyimide printed circuit board 350 disposed therebetween. Component capacitor C50 is likewise formed from front and back copper foils 303 and 304 with the thin printed circuit board 350 disposed therebetween. Each of the other component capacitors is likewise formed. The copper foil on the back side of each component capacitor C40 to C43 and C50 to C53 is connected to a common back-side interconnect ion line 305. As a result, the parallel-connected component capacitors C40 to C43, and the parallel-connected component capacitors C50 to C53 are connected in series. A through-hole 306 is provided in the printed circuit board 350 to the back-side interconnect ion line 305.

The other parallel-connected component capacitors C44 to C46, and parallel-connected component capacitors C54 to C56 are likewise connected in series by back-side interconnect 320. A through-hole 321 is also provided in the printed circuit board 350 to this back-side interconnect ion line 320. Parallel-connected component capacitors C47 and C48, and parallel-connected component capacitors C57 and C58 are likewise connected in series by back-side interconnect ion line 330, and a through-hole 331 is provided to this back-side interconnect 330. Series-connected component capacitors C49 and C59 are likewise connected to a back-side interconnect ion line 340, and a through-hole 341 is likewise provided thereto.

Figure 9:
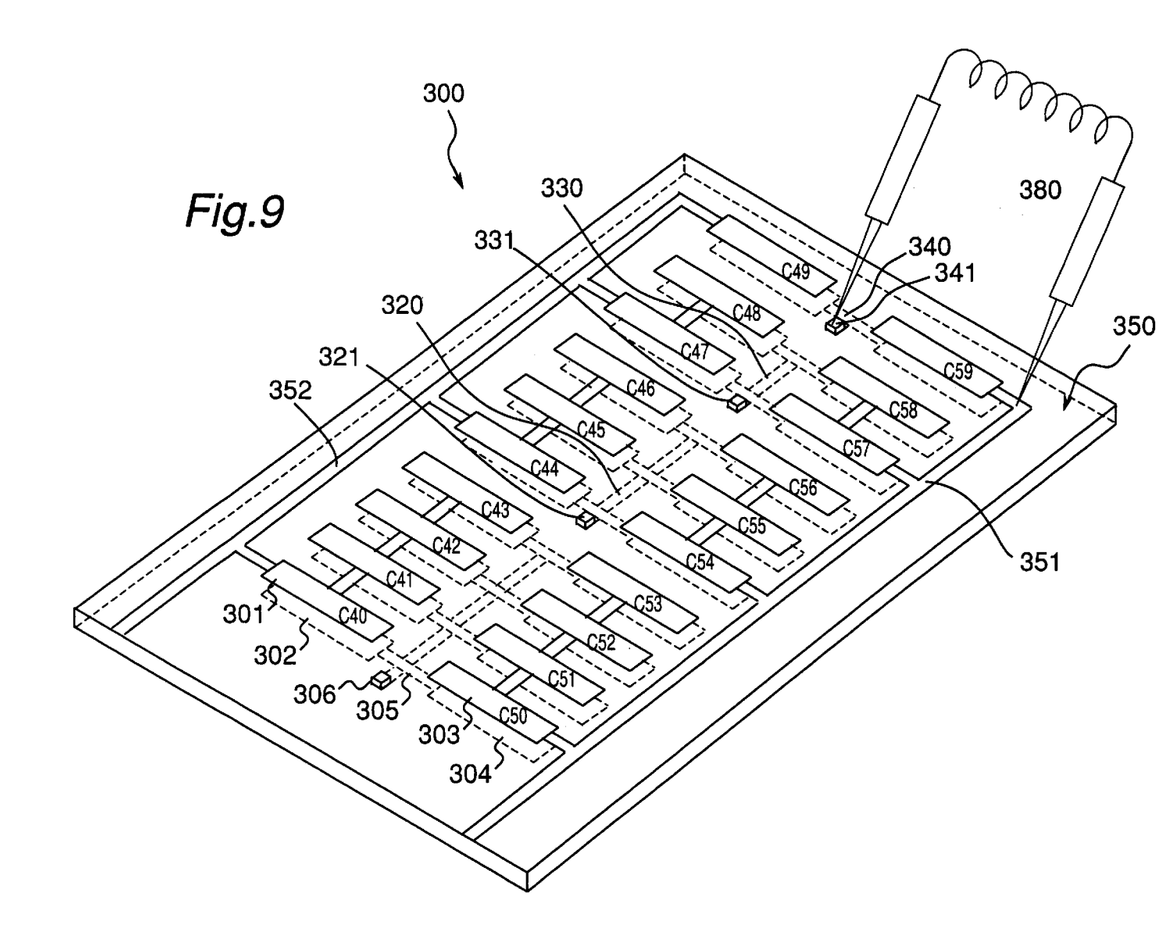
FIG. 9 is an oblique view of a capacitor network according to a fifth example of the present invention.
Figure 10:
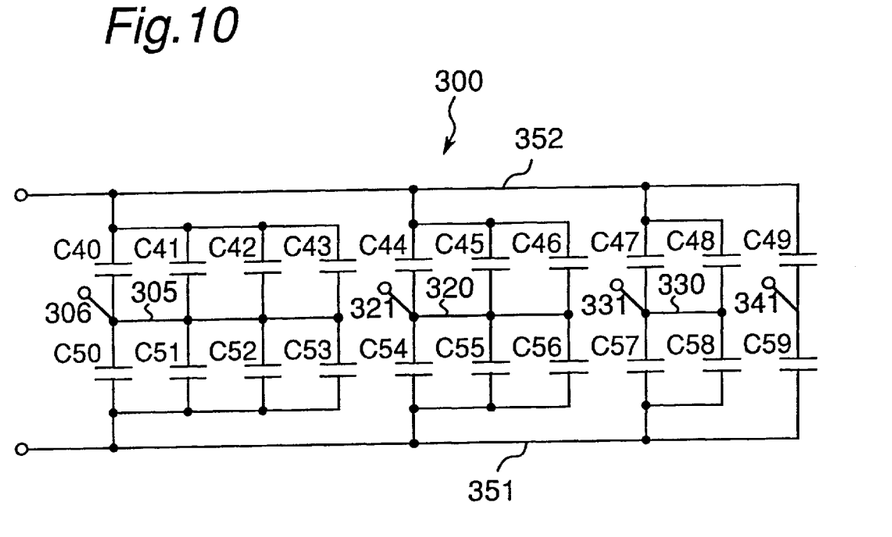
FIG. 10 is an equivalent circuit diagram of the capacitor network shown in FIG. 9.

FIG. 10 is an equivalent circuit diagram of the capacitor network 300 shown in FIG. 9. The methods of increasing and decreasing the network capacitance are the same as with the capacitor network 200 according to the fourth embodiment. Before any of the lines are actually cut, however, one of the front-side interconnects 351 or 352 is contacted with one of the probes, and the other probe is inserted through one of the through-holes 306, 321, 331, or 341 to contact the corresponding back-side interconnect and increase the capacitance of the capacitor network 300 2, 4, 6, or 8 pF without actually short circuiting any component capacitor.

It is therefore possible to determine whether the capacitance must be increased or decreased before actually cutting any lines or short circuiting any component capacitors. It is therefore possible to adjust the capacitor network 300 to the capacitance enabling the greatest read/write distance between the IC card using the capacitor network 300 and a reader/writer more efficiently and with less manipulation of the capacitor network 300.

It will also be clear that as an alternative to providing vias 306, 321, 331, and 341, the back-side interconnects can be connected to contacts at a side of the printed circuit board 350.

As described above, a capacitor network according to the present invention thus meets the need for a capacitor network of simple configuration whereby the composite capacitance of the capacitor network can be easily and reversibly increased and decreased.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A capacitor network having a plurality of component capacitors formed from two metallic foil layers on opposite sides of a printed circuit board interconnected by lines disposed on said printed circuit board, said capacitor network comprising:

at least two series circuit sections each comprising at least two component capacitors, connected in series;

said at least two series circuit sections being connected in parallel.

2. The capacitor network as set forth in claim 1, wherein lines on a front and back sides of the printed circuit board are disposed at non-overlapping positions.

3. The capacitor network as set forth in claim 1, wherein the two metallic foil layers used to form component capacitors of said series circuit sections, at least one of the foils is plastically deformable, conductive material a conductive contact is established between the foils by inserting a needle in one of said metallic foils.

* * * * *